Figure 1:
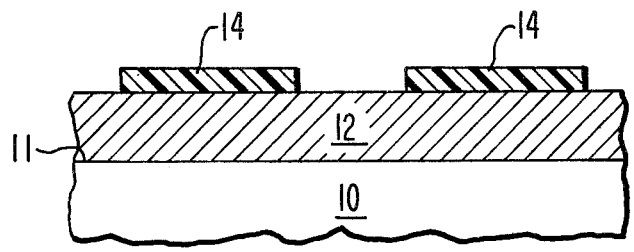

United States Patent [19]

Goodman et al.

[11] 4,199,773

[45] Apr. 22, 1980

[54] INSULATED GATE FIELD EFFECT SILICON-ON-SAPPHIRE TRANSISTOR AND METHOD OF MAKING SAME

[75] Inventors: Alvin M. Goodman, Princeton, N.J.; Charles E. Weitzel, Scottsdale, Ariz.

[73] Assignee: RCA Corporation, New York, N.Y.

[21] Appl. No.: 938,266

[22] Filed: Aug. 29, 1978

[51] Int. Cl.$^2$ ............................................. H01L 29/72
[52] U.S. Cl. .......................................... 357/23; 357/4; 357/42; 357/49; 357/89; 357/91
[58] Field of Search .................. 357/23, 4, 42, 49, 89, 357/91

[56] References Cited

U.S. PATENT DOCUMENTS 4,106,045  8/1978  Nishi ..................................... 357/23
4,143,266  3/1979  Borel et al. ............................ 357/23

*Primary Examiner*—Edward J. Wojciechowicz
*Attorney, Agent, or Firm*—H. Christoffersen; D. S. Cohen; L. P. Benjamin

[57] ABSTRACT

A silicon-on-sapphire structure and method for forming the same is described wherein the leakage current attributable to "back channel" leakage is minimized by forming the channel region in such a manner as to have provided therein at least two levels of dopant concentration. The heavier level of dopant concentration is positioned adjacent the silicon/sapphire interface while the lighter level of dopant concentration occupies the remainder of the channel region and is shallower than the heavier level. The classic inversion process takes place in the lightly doped section at the shallow level.

10 Claims, 4 Drawing Figures

INSULATED GATE FIELD EFFECT SILICON-ON-SAPPHIRE TRANSISTOR AND METHOD OF MAKING SAME

This invention relates, in general, to semiconductor devices and more particularly to silicon-on-sapphire (SOS) insulated gate field effect transistors (IGFETs) and the manufacture thereof.

To achieve high yield in the manufacture of integrated circuits, especially in complementary devices, it is necessary to fabricate the individual transistors in such a manner that the characteristics of one device are as closely matched with the corresponding characteristics of its complementary transistor as is possible. One very important inherent defect that must be minimized, from the first, is leakage current since if the leakage current becomes too high in one device, the entire circuit may not function and, if it does function will not provide satisfactory results when used in a complementary configuration.

SOS transistors, in addition to having the conventional source of leakage current, have a potential leakage path between the source and the drain regions that lies adjacent the silicon/sapphire interface. This leakage path is referred to as "back channel" leakage. The back channel leakage is usually attributable to the fact that the gate of the transistor is far removed from the interface and as a result, fixed charge which can either accumulate, or be formed at the interface during the manufacture of the devices can induce a channel of mobile charges that cannot be controlled by the gate potential. This charge may in some instances be of such a magnitude that the electrical properties of the silicon adjacent the interface may be significantly altered and inverted. For example, if a large amount of fixed positive charge forms or is formed at the silicon/sapphire interface in an N channel device (using P type material) the P type material will become inverted. The net result would be the formation of a layer of N type material at the silicon/sapphire interface, through which leakage current would flow from source to drain. This is an obviously undesirable situation. To make matters more complicated, this leakage current problem has been found to be more predominant in N channel devices using a P type material. While the same phenomenon occurs, to a lesser degree in P channel devices, (using N type material), it is more advantageous to produce SOS devices having little or no leakage current or at least to minimize the leakage current in complementary SOS transistors.

One of the prior art methods of tailoring the characteristic of each transistor of a complementary silicon-on-sapphire field effect transistor (C/SOS/FET) configuration is shown in our recent U.S. Pat. No. 4,091,527 entitled "METHOD FOR ADJUSTING THE LEAKAGE CURRENT OF SILICON-ON-SAPPHIRE INSULATED GATE FIELD EFFECT TRANSISTORS" which issued on May 30, 1978 and is assigned to the same assignee as the subject application. In our patent there is described a method for adjusting or tailoring the leakage current of silicon-on-sapphire field effect transistors by either introducing or by removing negative charge from the silicon/sapphire interface by a process of oxidation and annealing, respectively. The oxidation and annealing steps used in our prior patent are in addition to those processing steps normally used in the manufacture of silicon-on-sapphire devices. In our patent, the magnitude and the sign of the trapped charge resulting in back channel leakage has been found to be affected by preoxidizing the silicon of the transistor prior to forming the transistor and by annealing in a reducing atmosphere in addition to the usual process steps necessary for forming the transistor.

As distinguished from our prior method of reducing back channel leakage it is now proposed that a doping technique be utilized in order to minimize the effect of the charge at the silicon/sapphire interface. However, if one would merely increase the doping of the P type region so that the region has a higher concentration of dopant atoms therein while the leakage current would be reduced, it would become obvious that the threshold voltage would also be raised significantly. This, in and of itself, would be highly undesirable.

As further background for the manufacture of an SOS P-channel field transistor, attention is directed to U.S. Pat. No. 3,885,993 to J. Tihanyi entitled "METHOD OF PRODUCTION OF P CHANNEL FIELD EFFECT TRANSISTORS AND PRODUCT RESULTING THEREFROM" which issued on May 27, 1975 which discloses a method for reducing the presence of negative charges at the silicon/spinel interface.

Another process relating to the general subject matter is described in U.S. Pat. No. 3,867,196, which issued to P. Richman on Feb. 18, 1975, entitled "METHOD FOR SELECTIVELY ESTABLISHING REGIONS OF DIFFERENT SURFACE CHARGE DENSITY IN A SILICON WAFER". In this process, material which acts as an oxygen barrier is placed on a selected portion of the surface of the silicon to simulate a final anneal in an inert atmosphere. This process is carried on solely at the portion of the silicon surface underlying the oxygen barrier and serves to establish a minimum surface charge density thereunder.

Still another prior art method which is addressed to the charge appearing at the silicon/sapphire interface, is U.S. Pat. No. 3,806,371 which issued on Apr. 23, 1974 to Barone and is entitled "METHOD OF MAKING COMPLEMENTARY MONOLITHIC INSULATED GATE FIELD EFFECT TRANSISTORS HAVING LOW THRESHOLD VOLTAGE AND LOW LEAKAGE CURRENT". This patent describes a method for providing low threshold, low leakage current complementary IGFETS by using a gettering technique. A layer of gettering glass is deposited on the back of a wafer prior to the gate oxidation in order that the glass act as a getter for the undesired charge in order to lower the leakage current in the completed device.

Recently, in the IBM Technical Disclosure Bulletin No. 3 at Vol. 118, which issued on August, 1975 to Burkhardt et al. it is disclosed that charge reduction in a gate insulator maybe achieved by a post-oxidation anneal in a reducing or neutral atmosphere.

In an article written by Allison et al. in the Proceedings of the IEEE, September, 1969, at page 1494 it is discloses that a large electronic layer can be introduced at the bottom of the silicon surface adjacent a sapphire substrate if the silicon-on-sapphire film is heated for approximately 15 minutes in hydrogen or moisture at 500° C. to 1000° C.

The subject invention is directed to a novel method of processing SOS devices wherein the leakage current attributable to "back channel" leakage path is minimized. This is accomplished by forming the channel region in such a manner as to provide at least two levels of dopant concentration therein. The heavier level of dopant concentration is generally found adjacent the silicon/sapphire interface while the lighter level of dopant concentration (the more conventional dopant concentration) is in the remainder of the channel region. The heavier concentration of dopant atoms prevents leakage conduction at the interface while the inversion process, which supports conduction, takes place in the more conventionally doped level.

Figure 2:
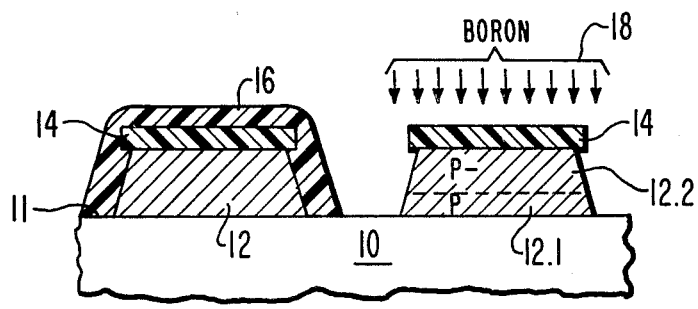
Figure 3:
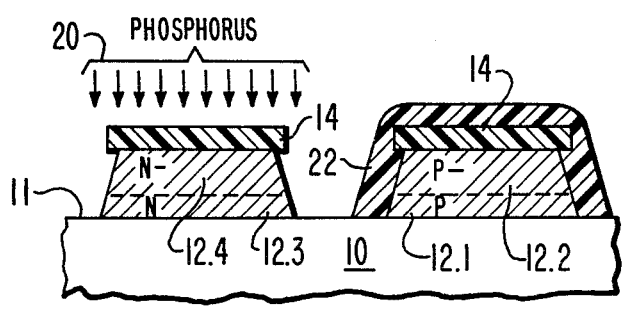
Figure 4:
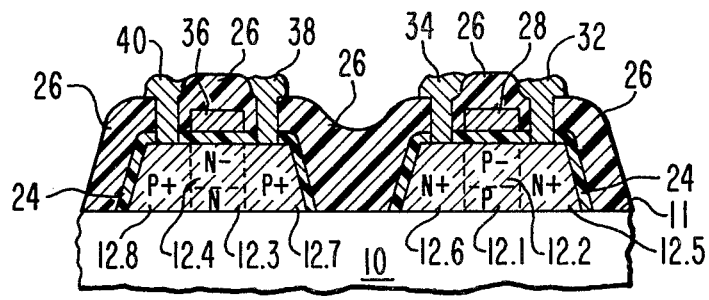

In the drawings:

FIGS. 1-3 depict varying processing steps, taken in cross-section, utilizing the principles of our invention; and FIG. 4 is a cross-sectional view of the completed semiconductor device fabricated in accordance with principles of our invention.

While the foregoing exegesis will be presented in terms of utilizing a sapphire insulative substrate, it will be obvious to those skilled in the art that our device may be fabricated on other insulative substrates such as, for example, spinel or monocrystalline beryllium oxide.

The formation of silicon islands on a sapphire substrate has been described in many publications, in the past. Briefly, however, as shown in FIG. 1, a layer of monocrystalline silicon 12 is deposited on surface 11 of sapphire body 10 using any one of many well known techniques one of which is the thermal decomposition of silane in a hydrogen carrier. After the deposition of monocrystalline silicon layer 12, to the desired thickness, layer 12 is provided with a mask 14 of silicon dioxide to expose certain areas. Layer 14 is provided with a patterned layer of photoresist (not shown) and the exposed portions of masking oxide layer 14 are then etched down to the monocrystalline layer 12 in order to allow the remaining, unetched portions of layer 14 to act as a mask for the subsequent etching of monocrystalline layer 12. At this point, the exposed portions of monocrystalline silicon layer 12 are removed by etching in a buffered potassium hydroxide etchant which not only removes the exposed silicon but will also generally etch under (undercut) masking layer 14, as shown in FIG. 2.

As shown in FIG. 2, the next processing step, after the formation of islands 12, is to cover all but the ones of the islands that are to be processed using mask 16 which may be either photoresistive material, aluminum, or deposited oxide etc. The principle consideration being that the mask be impervious to any subsequent ion implantation step. As shown by arrows 18, island 12 is implanted with boron atoms to produce P region 12.1. It is well known in the art that one may form P regions 12.1 by using either boron, aluminum, gallium or indium as the dopant with boron and aluminum presently being the most practical for the currently available ion implantation equipment. Hence, boron is mentioned, by way of example. The implant energy is adjusted so as to place most of the boron dopant atoms only inside the silicon island adjacent to the silicon/sapphire interface. Using boron atoms as the dopant and an energy level of about 130 KeV, one may expect a projected range of 0.4173 $\mu m(R_P)$. Using a projected standard deviation of 0.022 $\mu m(\Delta R_P)$ results in an implant maximum depth of about 0.4995 $\mu m$.

The goal that one desires to achieve is to produce, in area 12.1, a mechanism that will overcome the residual interfacial charge at flat band plus an additional amount as a safety factor. This is done by the above-described boron implant. However, one must guard against implant doses that are so high as to produce low drain breakdown voltage or a possible implantation damage to the silicon at the silicon/sapphire interface. Accordingly, it is felt that the maximum value of implant dose should be of the order of about $10^{14}/cm^2$ while at the other end of the spectrum, the minimum value of implant dosage should be of the order of $10^{11}/cm^2$. Typical values are likely to be in the range $1-5\times10^{12}/cm^2$ depending upon the processing.

After having performed the heavy implantation step, a lighter shallower second implantation is now performed on the same island. The boron concentration of this second implantation may be of the order of about $2\times10^{11}/cm^2$, or any other value which would be considered to be a normal implantation value to form area 12.2.

The next step in the process is determined by whether or not there is a need to minimize or remove "back channel" leakage current in the remaining, unprocessed islands. In order to more concisely describe our invention, it will be assumed that the reader desires to minimize "back channel" leakage current in the remaining unprocessed islands.

Referring now to FIG. 3 it will be seen that masking layer 16 (FIG. 2) is removed from all of the previously unprocessed islands and a new masking layer 22 is applied to the previously processed islands. As in FIG. 2 material of masking layer 22 may be either photoresistive material, aluminum or deposited oxide, etc., the principle consideration being that the masking layer be impervious to any of the subsequent implantation steps that will follow. In this Figure, it is desired to produce N region 12.3, in which event one may utilize as the dopant either phosphorus, arsenic, antimony or bismuth with arsenic and phosphorus presently being the most practical for the currently available ion implantation equipment. Hence, phosphorus will be mentioned by way of example. As in the description regarding FIG. 2, the implantation energy is adjusted so as to place most of the phosphorus dopant atoms only inside the silicon island adjacent to the silicon/sapphire interface. Using phosphorus atoms as the dopant and an energy level of about 360 KeV, one may expect a projected range of about 0.4150 $\mu m(R_P)$. Using a projected standard deviation of about 0.0796 $\mu m$ ($\Delta R_P$) results in an implant maximum depth of about 0.4946 $\mu m$.

This is accomplished, as shown by arrows 20, by heavily implanting the exposed islands with phosphorus atoms to produce N regions 12.3. As in the previously described implantation (regarding the P regions 12.1), the goal that one desires to achieve is to produce in areas 12.3 a mechanism that will overcome the residual interfacial charge at flat band plus an additional amount as a safety factor. As before, one must guard against implant doses that are excessively high and which will produce low breakdown voltage or possible implantation damage. After having performed the heavy implantation step, a lighter shallower second implantation is now performed on the same island. The phosphorus concentration of the second implant may be of the order of magnitude that would be considered to be a normal implantation value to form area 12.2.

Having formed an N channel field effect transistor and a P channel field effect transistor, the next step in the process is to remove any and all masking material such as layer 16 of FIG. 2 or layer 22 of FIG. 3 as well as layers 14 so that all the islands are now exposed. As shown in FIG. 4 the now exposed surfaces of the islands is provided with a layer of dielectric or dielectrics 24 which may be formed either by the oxidation of the exposed surface of each of the silicon islands or by the thermal decomposition of silane in an oxidizing atmosphere. As an alternative a channel oxide may be grown over the islands by an HCl steam oxidation process at about 900° C. for approximately 60 minutes in order to grow a layer thereon of approximately 1200 Å, for example. Thereafter a layer of polycrystalline silicon (polysilicon) is deposited (not shown) by the pyrolysis of silane and hydrogen on the channel oxide layer 24. The next step is to define gates in the polysilicon layer, and this is done by etching the polysilicon layer to form gates 28 and 36. The polysilicon gates 28 and 36 are then used as a mask to etch away the exposed portions of silicon dioxide gate oxide layer in order to define sources 12.5 and 12.7 as well as drains 12.6 and 12.8. Thereafter, using the now formed polysilicon gate as a mask the N type drain and source electrodes are formed in one island while the other island is masked after which the mask is removed therefrom and a new mask grown or deposited on the previously processed islands and the P type drain 12.8 and source 12.7 are formed by either implantation or by diffusion using any of the many well known procedures.

By way of example, polysilicon gates 28 and 36 may be doped with the same dopant and at the time as the sources and drains region associated therewith are doped.

Thereafter, a layer of field oxide 26 is deposited over the entire structure and is suitably masked to form contact openings to the various sources and drains followed by a metallizing step in order to form electrodes 32, 34, 38 and 40 in ohmic contact with the sources and drains as shown.

What is claimed is:

1. In a semiconductor having an insulative substrate and a major surface associated therewith, a plurality of islands of semiconductive material affixed to the major surface of the substrate; each island having:
   a top surface substantially parallel to the major surface of the substrate;
   spaced drain and source regions of one conductivity type; and
   a channel region associated with a spaced drain and source region and having an opposite conductivity type;
   the improvement comprising:
   a first part of the channel region, extending from the source region to the drain region and adjacent to the major surface having a given, heavy concentration of dopant atoms therein sufficient to prevent back channel leakage between the source and drain; and
   a second part of the channel region, coextensive with the first part of the channel region, located between the first part of the channel region and the top surface thereof, having a second, lighter concentration of dopant atoms than the first part and sufficient to allow inversion at the top surface.

2. The semiconductor of claim 1, wherein:
   selected ones of the plurality of islands have N type conductivity source and drain regions; and
   the remaining ones of the plurality of islands have P type conductivity source and drain regions.

3. The semiconductor of claim 2, wherein:
   the first part of each channel region of the ones of the islands having N type conductivity source and drain regions have an implanted dosage range from about $1\times10^{12}/cm^2$ to about $5\times10^{12}/cm^2$ dopant atoms;
   the second part of each channel region of the ones of the islands having N type conductivity source and drain regions have an implanted dosage of about $2\times10^{11}/cm^2$ dopant atoms.

4. The semiconductor of claim 3, wherein:
   the first and second portions of the channel regions of the ones of the islands having N type conductivity source and drain regions are implanted with a dopant selected from the class consisting of boron, aluminum, gallium, and indium.

5. The semiconductor of claim 2, wherein:
   the first part of each channel region of the ones of the islands having P type conductivity source and drain regions have an implanted dosage ranging from about $1\times10^{12}/cm^2$ to about $5\times10^{12}/cm^2$; and
   the second part of the channel region of the ones of the islands having P type conductivity source and drain regions have an implanted dosage of about $2\times10^{10}/cm^2$ dopant atoms.

6. The semiconductor of claim 5, wherein:
   the first and second parts of the channel regions of the ones of the islands having P type conductivity source and drain regions are implanted with a dopant selected from the class consisting of phosphorus, arsenic, antimony and bismuth.

7. In a process for fabricating a semiconductor device having an insulative substrate and a major surface associated therewith in which a plurality of islands of semiconductor are affixed to the major surface of the substrate and where each island is provided with:
   a top surface substantially parallel to the major surface of the substrate;
   spaced source and drain regions of one conductivity type; and
   a channel region associated with a spaced drain and source region and having an opposite conductivity type;
   the improved process comprising the steps of:
   implanting a first dopant into a first part of certain ones of the channel region to a dosage ranging from about $1\times10^{12}/cm^2$ to about $5\times10^{12}/cm^2$ dopant atoms adjacent to the major surface;
   implanting the first dopant in a second part of the certain ones of the channel region to a dosage of about $2\times10^{10}/cm^2$ to about $2\times10^{11}/cm^2$ dopant atoms adjacent the top surface of the island;
   forming drain and source regions in the certain ones of the islands to abut the first and second parts of the channel region.

8. The improved process of claim 7, wherein:
   the source and drain regions of the certain ones of the plurality of islands are of N type conductivity; and
   the remaining ones of the plurality of islands are of P type conductivity source and drain regions.

9. The improved process for fabricating a semiconductor of claim 8, wherein:
   the first and second parts of the channel regions of the ones of the islands having N type conductivity source and drain regions are implanted with a dopant selected from the class consisting of boron, aluminum, gallium, and indium.

10. The process of claim 9 wherein:
    the first and second parts of a channel region of the ones of the islands having P type conductivity source and drain regions are implanted with a dopant selected from the class consisting of phosphorus, arsenic, antimony and bismuth.

* * * * *